(12) United States Patent
Saito

(10) Patent No.: US 7,029,644 B2
(45) Date of Patent: Apr. 18, 2006

(54) METHOD FOR PRODUCING A POLYCRYSTALLINE SILICON, POLYCRYSTALLINE SILICON AND SOLAR CELL

(75) Inventor: Tadashi Saito, Hamura (JP)

(73) Assignees: National University Corporation, Tokyo (JP); Tokyo University of Agriculture and Technology, Tokyo (JP)

( * ) Notice: Subject to any disclaimer, the term of this patent is extended or adjusted under 35 U.S.C. 154(b) by 0 days.

(21) Appl. No.: 10/452,634

(22) Filed: Jun. 3, 2003

(65) Prior Publication Data

US 2004/0067647 A1 Apr. 8, 2004

(30) Foreign Application Priority Data

Oct. 7, 2002 (JP) .................... 2002-293824

(51) Int. Cl.
*C01B 33/02* (2006.01)
*C22C 29/00* (2006.01)
*C22C 35/00* (2006.01)

(52) U.S. Cl. ............... 423/348; 423/115; 420/578
(58) Field of Classification Search ......... 423/111, 423/112, 115, 324, 325, 348; 501/94, 154; 420/578
See application file for complete search history.

(56) References Cited

U.S. PATENT DOCUMENTS 4,090,915 A * 5/1978 Keller ................. 438/591
4,129,463 A * 12/1978 Cleland et al. ........... 136/258
4,312,700 A * 1/1982 Helmreich et al. ........ 264/300
5,708,281 A * 1/1998 Morishita ............... 257/198
5,990,415 A * 11/1999 Green et al. ............ 136/255
6,236,059 B1 * 5/2001 Wolstenholme et al. ..... 257/3
6,515,317 B1 * 2/2003 Bazan et al. ............ 257/215
6,566,201 B1 * 5/2003 Blanchard .............. 438/268
6,710,400 B1 * 3/2004 Blanchard .............. 257/328

FOREIGN PATENT DOCUMENTS

| JP | 06-091815 | 7/1994 |
|---|---|---|
| JP | 2001-048518 | 2/2001 |
| JP | 2001-064007 | 3/2001 |
| JP | 2002-068724 | 3/2002 |
| WO | WO 00/73542 A1 | 7/2000 |

OTHER PUBLICATIONS

Dhamrin et al., "A Feasibility Study on Gallium Doping for Higher Quality Multicrystalline Silicon Cast Wafers", Tokyo A&T University, 12$^{th}$ Workshop, pp. 72–79, Aug. 2002.
Ehrstein, "Spreading Resistance Calibration for Gallium– or Aluminum–Doped Silicon", J. Electrochem. Soc.: Solid–State Science and Technology, pp. 1403–1404, Jun. 1980.
Kaiejs, et al.; *12$^{th}$ Workshop on Crystalline Silicon Solar Cell Material and Process*; National Renewable Energy Laboratory; Aug. 2002.
Dhamrin M. et al.; *The Japan Society of Applied Physics*; 2002.

* cited by examiner

*Primary Examiner*—Colleen P. Cooke
(74) *Attorney, Agent, or Firm*—Oliff & Berridge, PLC

(57) ABSTRACT

Silicon raw material and gallium dopant are charged and mixed in a crucible. The silicon raw material is heated to a predetermined temperature, and melted under an inactive gas atmosphere. The melted silicon raw material is cooled down to be crystallized to make a polycrystalline silicon incorporating the gallium dopant.

4 Claims, 1 Drawing Sheet

METHOD FOR PRODUCING A POLYCRYSTALLINE SILICON, POLYCRYSTALLINE SILICON AND SOLAR CELL

BACKGROUND OF THE INVENTION

1. Field of the Invention

This invention relates to polycrystalline silicon which is usable as silicon substrates for solar cells, and a method for producing the polycrystalline silicon.

2. Related Art

From 1995 onward, the global market of solar cells has been largely developed per about 30% every year. In 2001, the worldwide amount of the solar cell production was 390 MWp, which is almost close to 400 MWp. The large development of the global market of solar cells is mainly originated from the development for residential application. As of now, various solar cells are used for various applications, and in 2001, according to Mr. P. Haycock, crystalline silicon solar cells are much used which are made from Cz single crystalline silicon crystal or casted polycrystalline silicon. Therefore, in the global market of solar cells, the ratio of the Cz single crystalline silicon solar cells or the casted polycrystalline silicon solar cells for all of the silicon solar cells has increased. In addition, in view of the single crystalline silicon solar cells and the polycrystalline silicon solar cells, the ratio of the crystalline silicon solar cells for all of the solar cells increased up to 83%. In view of electrical power use, the crystalline silicon solar cells have been dominant.

About 50% of the crystalline silicon solar cells is made from polycrystalline silicon by means of casting method. Concretely, the casted polycrystalline silicon is utilized as p-type polycrystalline silicon by doping B therein to form the substrates of solar cells.

In the B-doped p-type polycrystalline silicon, however, the optical and electrical properties such as of minority-carrier lifetimes may be deteriorated due to the irradiation of sunlight. Therefore, if such a deteriorated polycrystalline silicon is employed as a substrate of a solar cell, the short-circuit current density and the open-circuit voltage of the solar cell may be also deteriorated, so that the various device performances of the solar cell such as conversion efficiency may be degraded.

SUMMARY OF THE INVENTION

It is an object of the present invention to provide a new polycrystalline silicon wherein the optical and electrical properties such as minority-carrier lifetimes are not almost deteriorated and thus, the various device performances such as conversion efficiency are not almost deteriorated.

In order to achieve the above object, this invention relates to a method for producing polycrystalline silicon, comprising the steps of:

charging and mixing silicon raw material and gallium dopant in a crucible, melting said silicon raw material under an inactive gas atmosphere through heating to a predetermined temperature, and cooling down said silicon raw material melted to be crystallized to make a polycrystalline silicon incorporating said gallium dopant.

The inventors had been intensely studied to achieve the above object. In view of the development of the conversion efficiency of a solar cell, it is required to reduce the resistivity of polycrystalline silicon to be used as a substrate and thus, to add a large amount of B dopant or the like into the poly crystalline silicon. In this case, however, the carrier lifetime may be deteriorated and various performances may be deteriorated under sunlight.

In this point of view, the inventors had much studied to find out the fact that the minority-carrier lifetime in the polycrystalline silicon can be developed by adding Ga dopant therein, instead of conventional B dopant. Therefore, if Ga dopant is incorporated in the polycrystalline silicon by a given amount to be employed as a substrate of a solar cell, the optical and electrical properties are not almost deteriorated due to the dopant, and thus, the various performances such as conversion efficiency of the solar cell can be developed.

In a preferred embodiment of the present invention, the polycrystalline silicon is annealed after the formation as mentioned above. In this case, defects in the polycrystalline silicon can be almost removed and the minority-carrier lifetime can be much developed.

In another embodiment of the present invention, in the addition of the Ga dopant into the silicon raw material, oxygen-including compound is also added into the silicon raw material. In this case, the oxygen content of the intended polycrystalline silicon can be increased to some level, and thus, the crystal strength of the polycrystalline silicon can be developed. As a result, even though a thinner substrate is made from the polycrystalline silicon, the mechanical strength of the substrate can be much developed.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
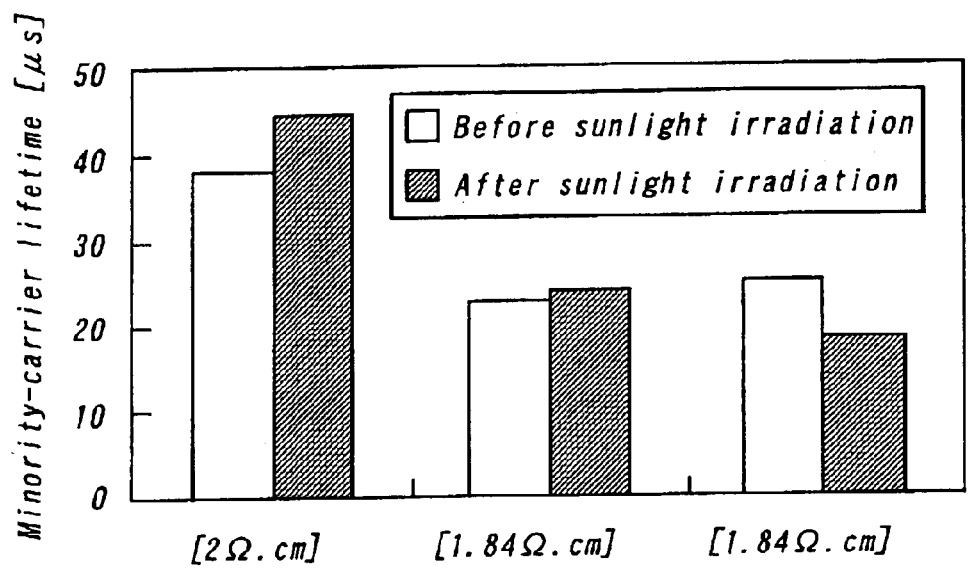
FIG. 1 is a graph showing the minority-carrier lifetime of an annealed polycrystalline silicon before and after the irradiation of sunlight.

This invention will be described in detail with reference to the accompanying drawings.

In the present invention, first of all, silicon raw material and Ga dopant are charged into a crucible. As the silicon raw material, powdery, granular or flack raw material may be employed. As the Ga dopant, powdery, granular or flaky or scaly dopant may be also employed.

The amount of the Ga dopant for the silicon raw material depends on the Ga content of the intended polycrystalline silicon. Concretely, the amount of Ga dopant is preferably set within $5 \times 10^{-4}$–$6.3 \times 10^{-2}$ atomic %, more preferably within $2 \times 10^{-3}$–$2.3 \times 10^{-2}$ atomic %. In this case, the Ga content of the intended polycrystalline silicon can be set within $4 \times 10^{-6}$–$5 \times 10^{4}$ atomic %, preferably within $1.6 \times 10^{-5}$–$1.8 \times 10^{-4}$ atomic %. Therefore, the minority-carrier lifetime of the poly crystalline silicon can be developed effectively.

Then, the silicon raw material charged into the crucible is heated to a predetermined temperature, and melted under an inactive gas atmosphere. The heating and melting processes can be performed by disposing the crucible into an electric furnace or the like. The inactive gas atmosphere can be formed by charging or flowing an inert gas or a nitrogen gas in or through the furnace. For example, the heating temperature is set within 1450–1600° C.

Then, the crucible is gradually cooled down in the furnace to crystallize the melted silicon raw material. The cooling rate is preferably set within 0.1–1° C./min. In this case, the crystallinity of the polycrystalline silicon can be easily enhanced.

In the present invention, oxygen-including compound may be added the mixture of the silicon raw material and the Ga dopant in the crucible. In this case, the oxygen-including compound is preferably added so that the oxygen content of the intended polycrystalline silicon is set within $10^{16}/cm^3$–$10^{18}/cm^3$. In this case, the crystal strength of the poly crystalline silicon can be enhanced, so that if a thinner substrate with a thickness of 200 μm is made of the poly-crystalline silicon, the mechanical strength of the substrate can be enhanced sufficiently.

As the oxygen-including compound, silicon oxide which includes oxygen as constituent element can be employed. In this case, another element except silicon, gallium and oxygen can not be incorporated into the poly-crystalline silicon.

The minority-carrier lifetime of the polycrystalline silicon can be increased to 40 μs through the above-mentioned process. In contrast, the minority-carrier lifetime of a conventional B-doped polycrystalline silicon is about 15 μs, so that the minority-carrier lifetime of the present invention can be increased almost three times as large as the one of the conventional B-doped polycrystalline silicon.

EXAMPLES

Example 1

4.5 kg of silicon raw material and 0.25 g ($2\times10^{-3}$ atomic %) of gallium metal were charged into a quartz crucible of which inner surface is coated with a mold lubricant. The mixture was heated to 1550° C. under an Ar gas atmosphere to melt the silicon raw material. After the melting, the crucible was cooled down at a rate of 1° C./min to crystallize the melted silicon raw material. The resultant crystalline silicon ingot was cut off, and then, the cross section of the silicon ingot was observed. As a result, it was confirmed that in the silicon ingot, polycrystalline boundaries were created vertically, and thus, silicon crystals were created in columnar.

Then, the polycrystalline silicon ingot was cut off with a wire saw to make a substrate with a thickness of 300 μm. In this case, the resistivity of the polycrystalline silicon ingot was within a range of about 1–2 Ωcm, and decreased in the upper portion thereof.

In order to remove the slice damaged layer formed at the surface of the substrate, the substrate was immersed into HNO$_3$/NF solution to etch the surface of the substrate in mirror. Then, the substrate was immersed into iodine-ethanol solution so that the surface of the substrate was chemically passivated. A simulated sunlight (spectrum: AM1.5, intensity: 100 mW/cm$^2$) was irradiated onto the substrate for 2.5 hours by means of an optical conductivity attenuating method using microwave to measure the minority-carrier lifetime of the substrate. The measurement result was listed in Table 1.

Comparative Example 1

Except that 0.40 mg of boron was employed, instead of the gallium metal, a crystalline silicon was produced in the same manner as in Example 1. The resultant crystalline silicon was cut off and the cross section of the silicon ingot was observed. As a result, it was confirmed that in the silicon ingot, polycrystalline boundaries were created vertically, and silicon crystals were created in columnar. The silicon ingot was cut off in the same manner as in Example 1 to make a substrate with a thickness of 300 μm. After the chemical passivation for the substrate, the minority-carrier lifetime was measured in the same manner as in Example 1. The measurement result was listed in Table 1.

TABLE 1

| Dopant species | Minority-carrier lifetime before light irradiation (μs) | Minority-carrier lifetime after light irradiation (μs) |
|---|---|---|
| Ga | 42 | 42 |
| B | 14 | 5 |

As is apparent from Table 1, in the B-doped polycrystalline silicon, the minority-carrier lifetime before the light irradiation was 14 μs, and in contrast, in the Ga-doped polycrystalline silicon, the minority-carrier lifetime after the light irradiation was 42 μs. As a result, with the minority-carrier lifetime, the Ga-doped polycrystalline silicon was three times as large as the B-doped polycrystalline silicon. In addition, after the light irradiation, the minority-carrier lifetime of the B-doped polycrystalline silicon decreased to 5 μm from 14 μs, and the minority-carrier lifetime of the Ga-doped polycrystalline silicon did not almost decreased.

In other words, in comparison with the conventional B-doped polycrystalline silicon, the Ga-doped polycrystalline silicon, according to the present invention, has a large minority-carrier lifetime and no light degradation because of the non-decrease of the minority-carrier lifetime after the light irradiation.

Example 2

A Ga-doped polycrystalline silicon ingot was made in the same manner as in Example 1, and then, cut off with a wire saw to make three substrates with a thickness of 300 μm. The resistivities of the substrates were 2 Ωcm, 1.84 Ωcm and 1.84 Ωcm, respectively.

Then, the substrates were annealed at a temperature of 200° C. for 10 minutes under an inert gas atmosphere. Thereafter, a simulated-sunlight (spectrum: AM1.5, intensity: 100 m W/cm$^2$) was irradiated onto the substrates for 12 hours by means of the optical conductivity attenuating method to measure the minority-carrier lifetime of the substrates, respectively. The measurement result was drawn in FIG. 1. As is apparent from FIG. 1, the minority-carrier lifetime of the annealed substrates are not almost changed after the long irradiation of 12 hours.

Figure 2:
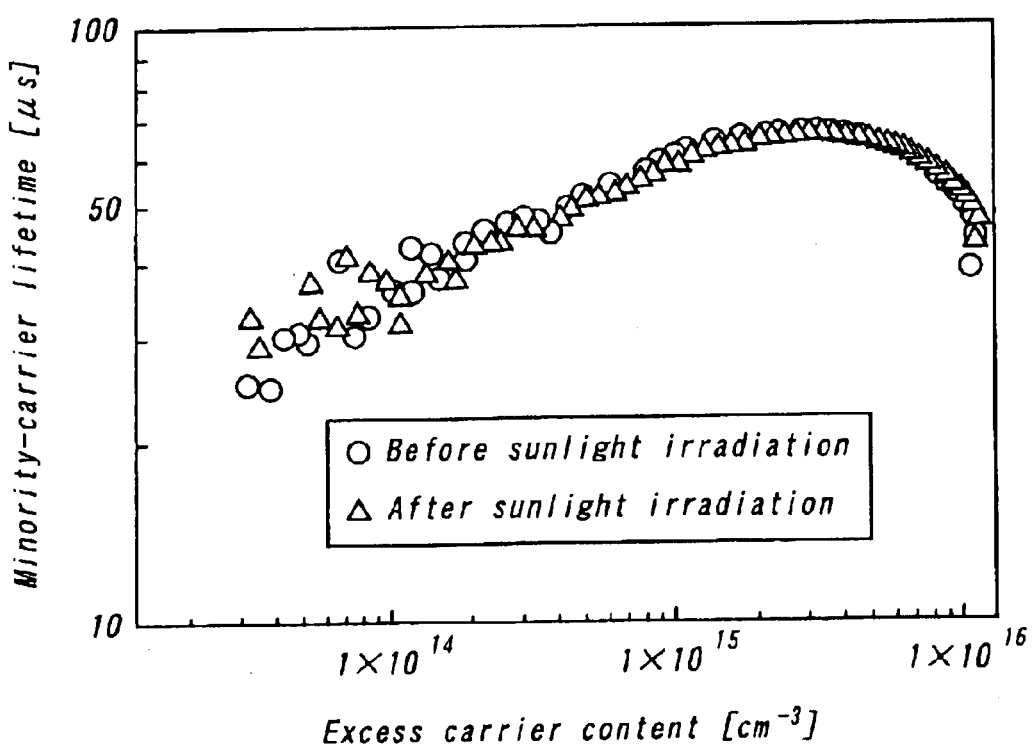
FIG. 2 is a graph showing the relation between the minority-carrier lifetime and the excess carrier contents of the annealed polycrystalline silicon.

Then, the relation between the minority-carrier lifetime and the excess carrier contents of the substrates made of the polycrystalline silicon was investigated by means of a quasi-static state photoconduction method (QSSPC), and drawn in FIG. 2. As is apparent from FIG. 2, there is a given correlation between the minority-carrier lifetime and the excess carrier contents within an excess carrier content range of $10^{13}$–$10^{16}/cm^3$, irrespective of the light irradiation. As a result, it was confirmed that the minority-carrier lifetimes of the substrates made of the polycrystalline silicon is not deteriorated by the light irradiation.

Example 3

4 kg of silicon raw material, 0.25 g ($2\times10^{-3}$ atomic %) of gallium metal and a predetermined amount of silicon oxide were charged into the quartz crucible. The mixture was heated and melted and then, a crystalline silicon ingot was made in the same manner as in Example 1. The crystalline silicon ingot was cut off to make a substrate with a thickness of 300 μm. The oxygen content of the substrate was $10^{18}$/cm$^3$, and the yield stress of the substrate at a temperature of 800° C. was 40 MPa. In contrast, the oxygen content of the substrate made in Example 1 was $10^{16}$/cm$^3$, and the yield stress of the substrate was 15 MPa.

In this way, if the oxygen content of the polycrystalline silicon increases, the crystal strength of the polycrystalline silicon can increase. Therefore, if a thinner substrate is made from the oxygen-including poly-crystalline silicon, the mechanical strength can be enhanced sufficiently.

Example 4

The substrate with the thickness of 300 μm, made in Example 1, was immersed into HNO$_3$/HF solution to etch the surface of the substrate in mirror, and then, heated to a temperature of 850° C. to make a pn junction by means of a p-type diffusion method. Thereafter, the substrate was coated with an anti-reflection film of SiN, and a p$^+$ layer was made at the rear surface of the substrate by means of an Al alloying method. Thereafter, Ag printed electrodes were formed at the rear surface and the main surface of the substrate to make a solar cell. A simulated-sunlight (AM1.5) was irradiated into the solar cell, and then, the conversion efficiency of the solar cell was measured. The measured conversion efficiency was 15.1% during one second from the measurement start. In addition, the measured conversion efficiency is not almost changed from 15.1% after the sunlight irradiation for 12 hours.

Comparative Example 2

A solar cell was fabricated from the substrate with the thickness of 300 μm made in comparative Example 1 in the same manner as in Example 4. The measured conversion efficiency of the solar cell was 14.3%.

As is apparent from Example 4 and comparative Example 2, the conversion efficiency of the solar cell depends on the minority-carrier lifetime of the polycrystalline silicon forming the substrate of the solar cell. In other words, the conversion efficiency of the solar cell increases as the minority-carrier lifetime of the polycrystalline silicon increases.

Although the present invention was described in detail with reference to the above examples, this invention is not limited to the above disclosure and every kind of variation and modification may be made without departing from the scope of the present invention.

As mentioned above, according to the present invention, a new polycrystalline silicon can be provided, wherein the optical and electrical properties such as minority-carrier lifetime are not almost deteriorated and thus, the various device performances such as conversion efficiency are not almost deteriorated.

What is claimed is:

1. Polycrystalline silicon comprising gallium dopant and oxygen with a content of $10^{16}$–$10^{18}$/cm, wherein the gallium dopant is substantially uniformly dispersed throughout said polycrystalline silicon.

2. The polycrystalline silicon as defined in claim 1, wherein the content of said gallium dopant is set within $5 \times 10^{-4}$–$6.3 \times 10^{-2}$ atomic %.

3. The polycrystalline silicon as defined in claim 1, further comprising a lifetime of at least 40 μs.

4. A solar cell comprising a substrate made of polycrystalline silicon as defined in claim 1.

* * * * *

UNITED STATES PATENT AND TRADEMARK OFFICE
CERTIFICATE OF CORRECTION

PATENT NO. : 7,029,644 B2  
APPLICATION NO. : 10/452634  
DATED : April 18, 2006  
INVENTOR(S) : Tadashi Saito, Katsuhiko Shirasawa and Teruhiko Hirasawa It is certified that error appears in the above-identified patent and that said Letters Patent is hereby corrected as shown below:

Please delete the following:

(75)    Inventor:    Tadashi Saito, Hamura (JP)

and replace with:

(75)    Inventors:   Tadashi Saito, Tokyo (JP); Katsuhiko Shirasawa, Kyoto (JP); Teruhiko Hirasawa, Tokyo (JP)

Signed and Sealed this

Twenty-second Day of August, 2006

JON W. DUDAS  
*Director of the United States Patent and Trademark Office*

UNITED STATES PATENT AND TRADEMARK OFFICE
CERTIFICATE OF CORRECTION

PATENT NO. : 7,029,644 B2
APPLICATION NO. : 10/452634
DATED : April 18, 2006
INVENTOR(S) : Tadashi Saito, Katsuhiko Shirasawa and Teruhiko Hirasawa It is certified that error appears in the above-identified patent and that said Letters Patent is hereby corrected as shown below:

Please delete the following:
On Title Page:

(75) Inventor: Tadashi Saito, Hamura (JP)

and replace with:

(75) Inventors: Tadashi Saito, Tokyo (JP); Katsuhiko Shirasawa, Kyoto (JP); Teruhiko Hirasawa, Tokyo (JP)

On Title Page:

Please delete the following:

(73) Assignees: National University Corporation, Tokyo (JP); Tokyo University of Agriculture and Technology, Tokyo (JP)

And replace with:

(73) Assignees: National University Corporation Tokyo University of Agriculture and Technology, Tokyo (JP); KYOCERA CORPORATION, Kyoto (JP); Dai-ichi Kiden Co., Ltd., Tokyo (JP)

Signed and Sealed this

Twentieth Day of February, 2007

JON W. DUDAS
*Director of the United States Patent and Trademark Office*